US011948909B2

(12) United States Patent
Sun et al.

(10) Patent No.: US 11,948,909 B2
(45) Date of Patent: Apr. 2, 2024

(54) PACKAGE COMPRISING SPACERS BETWEEN INTEGRATED DEVICES

(71) Applicant: QUALCOMM Incorporated, San Diego, CA (US)

(72) Inventors: Yangyang Sun, San Diego, CA (US); Dongming He, San Diego, CA (US); Lily Zhao, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 194 days.

(21) Appl. No.: 17/574,360

(22) Filed: Jan. 12, 2022

(65) Prior Publication Data
US 2023/0223375 A1 Jul. 13, 2023

(51) Int. Cl.
H01L 25/065 (2023.01)
H01L 23/00 (2006.01)
(Continued)

(52) U.S. Cl.
CPC .............. *H01L 24/73* (2013.01); *H01L 24/26* (2013.01); *H01L 24/32* (2013.01); *H01L 24/92* (2013.01); *H01L 25/0652* (2013.01); *H01L 25/0657* (2013.01); *H01L 25/18* (2013.01); *H01L 25/50* (2013.01); H01L 24/05 (2013.01); H01L 24/06 (2013.01); H01L 24/13 (2013.01); H01L 24/16 (2013.01); H01L 24/29 (2013.01); H01L 24/30 (2013.01); H01L 24/33 (2013.01); H01L 2224/0557 (2013.01); H01L 2224/06181 (2013.01); H01L 2224/13082 (2013.01); H01L 2224/16148 (2013.01);
(Continued)

(58) Field of Classification Search
CPC ...... H01L 24/73; H01L 24/16; H01L 25/0652
See application file for complete search history.

(56) References Cited

U.S. PATENT DOCUMENTS 8,008,130 B2 * 8/2011 Honda ................... H01L 24/97
438/614
2004/0222521 A1 11/2004 Hikita et al.
(Continued)

FOREIGN PATENT DOCUMENTS

EP 1750306 A1 2/2007
WO 2020264037 A1 12/2020

OTHER PUBLICATIONS

Partial International Search Report—PCT/US2022/053063—ISA/EPO—dated May 4, 2023.
(Continued)

*Primary Examiner* — Dale E Page
*Assistant Examiner* — Wilner Jean Baptiste
(74) *Attorney, Agent, or Firm* — Loza & Loza, LLP

(57) ABSTRACT

A package that includes a first integrated device comprising a first plurality of interconnects; a plurality of solder interconnects coupled to the first plurality of interconnects; a second integrated device comprising a second plurality of interconnects, wherein the second integrated device is coupled to the first integrated device through the second plurality of interconnects, the plurality of solder interconnects and the first plurality of interconnects; a polymer layer located between the first integrated device and the second integrated device; and a plurality of spacer balls located between the first integrated device and the second integrated device.

26 Claims, 12 Drawing Sheets

(51) Int. Cl.
  *H01L 25/00* (2006.01)
  *H01L 25/18* (2023.01)
(52) U.S. Cl.
  CPC .............. *H01L 2224/26125* (2013.01); *H01L 2224/2919* (2013.01); *H01L 2224/301* (2013.01); *H01L 2224/32145* (2013.01); *H01L 2224/33181* (2013.01); *H01L 2224/73104* (2013.01); *H01L 2224/73253* (2013.01); *H01L 2224/9211* (2013.01); *H01L 2225/06513* (2013.01); *H01L 2225/06517* (2013.01); *H01L 2225/0652* (2013.01); *H01L 2225/06541* (2013.01); *H01L 2225/06565* (2013.01)

(56) References Cited

U.S. PATENT DOCUMENTS

| | | |
|---|---|---|
| 2012/0211878 A1 | 8/2012 | Popovic et al. |
| 2017/0098633 A1* | 4/2017 | Kumar ................ H01L 23/3114 |
| 2017/0207199 A1* | 7/2017 | Kira ...................... H01L 25/074 |

OTHER PUBLICATIONS

International Search Report and Written Opinion—PCT/US2022/053063—ISA/EPO—dated Jun. 27, 2023.

\* cited by examiner

CROSS SECTIONAL PROFILE VIEW

CROSS SECTIONAL PROFILE VIEW

CROSS SECTIONAL PROFILE VIEW

US 11,948,909 B2

PACKAGE COMPRISING SPACERS BETWEEN INTEGRATED DEVICES

FIELD

Various features relate to packages that include an integrated device, and more specifically to a package that includes several integrated devices.

BACKGROUND

A package may include a substrate and integrated devices. These components are coupled together to provide a package that may perform various electrical functions. There is an ongoing need to provide better performing packages and reduce the overall size of the packages.

SUMMARY

Various features relate to packages that include an integrated device, and more specifically to a package that includes several integrated devices.

One example provides a package that includes a first integrated device comprising a first plurality of interconnects; a plurality of solder interconnects coupled to the first plurality of interconnects; a second integrated device comprising a second plurality of interconnects, wherein the second integrated device is coupled to the first integrated device through the second plurality of interconnects, the plurality of solder interconnects and the first plurality of interconnects; a polymer layer located between the first integrated device and the second integrated device; and a plurality of spacer balls located between the first integrated device and the second integrated device.

Another example provides a package that includes a substrate and a stack of integrated devices coupled to the substrate through a first plurality of solder interconnects. The stack of integrated devices comprises a first integrated device comprising a first plurality of interconnects; a second plurality of solder interconnects coupled to the first plurality of interconnects; a second integrated device comprising a second plurality of interconnects, wherein the second integrated device is coupled to the first integrated device through the second plurality of interconnects, the second plurality of solder interconnects and the first plurality of interconnects; a polymer layer located between the first integrated device and the second integrated device; and a plurality of spacer balls located between the first integrated device and the second integrated device.

Another example provides, a method for fabricating a package. The method provides a second integrated device comprising a second plurality of interconnects and a plurality of solder interconnects coupled to the second plurality of interconnects. The method provides a polymer layer and a plurality of spacer balls over the second integrated device. The method couples a first integrated device comprising a first plurality of interconnects, to the second integrated device such that the second integrated device is coupled to the first integrated device through the second plurality of interconnects, the plurality of solder interconnects and the first plurality of interconnects. The first integrated device is coupled to the second integrated device such that the polymer layer and the plurality of spacer balls are located between the first integrated device and the second integrated device.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a first integrated device comprising a first plurality of interconnects; a plurality of solder interconnects coupled to the first plurality of interconnects; a second integrated device comprising a second plurality of interconnects, wherein the second integrated device is coupled to the first integrated device through the second plurality of interconnects, the plurality of solder interconnects and the first plurality of interconnects; a polymer layer located between the first integrated device and the second integrated device; and a plurality of spacer balls located between the first integrated device and the second integrated device. The use of the plurality of spacer balls helps ensure that the space (e.g., bond line thickness) between the first integrated device and the second integrated device is consistent and/or uniform, which helps provide robust and reliable joints (e.g., solder joints) between the first integrated device (e.g., first die) and the second integrated device (e.g., second die).

Figure 1:
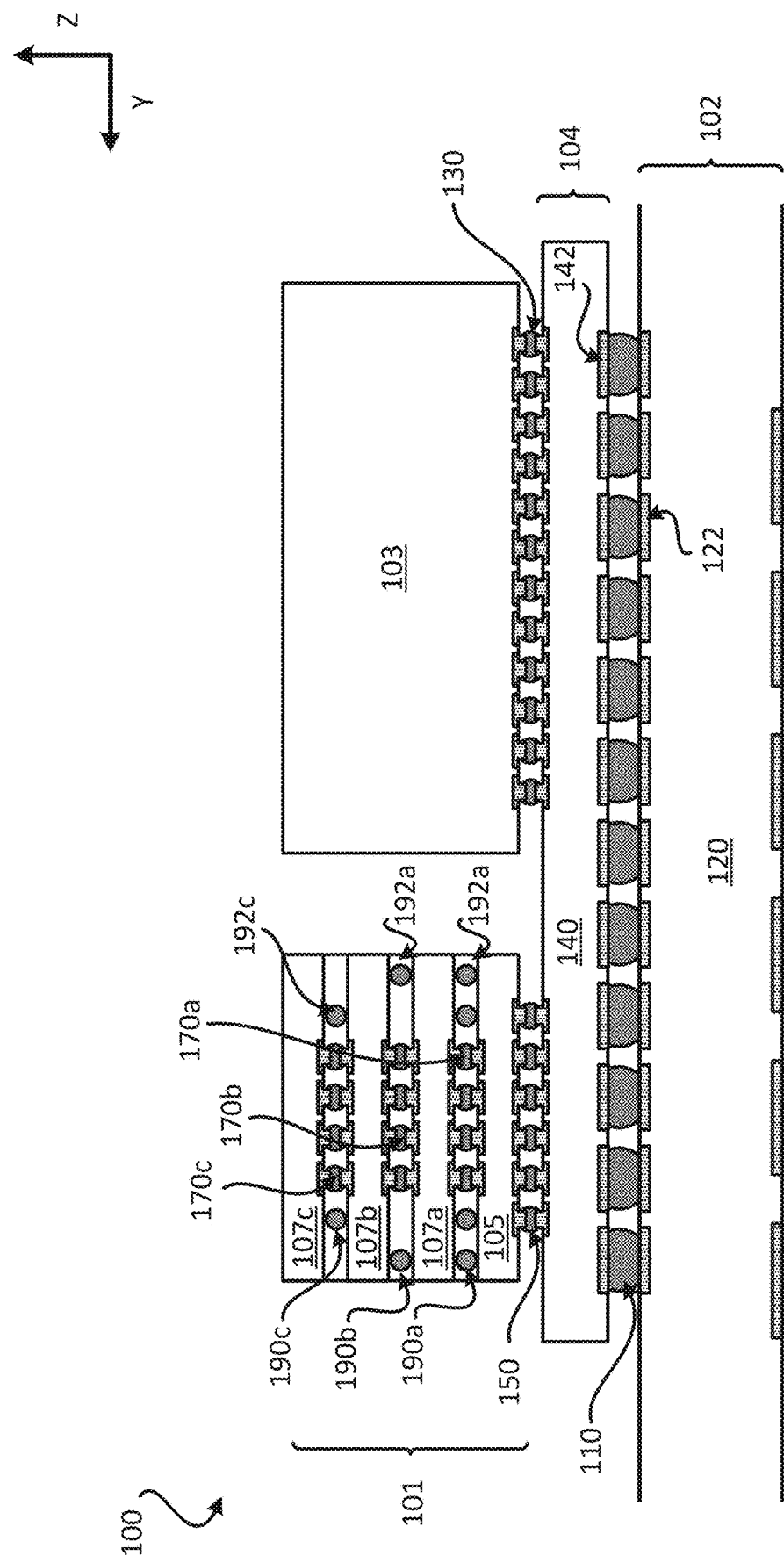
FIG. 1 illustrates a cross sectional profile view of a package that includes an integrated device coupled to another integrated device with spacer balls between the integrated devices.

Exemplary Package Comprising Integrated Device to Integrated Device Coupling with Spacers Between Integrated Devices FIG. 1 illustrates a package 100 that includes integrated device to integrated device coupling (e.g., die to die coupling) with spacers between integrated devices. The package 100 includes an integrated device stack 101, an integrated device 103, a substrate 102 and a substrate 104. The substrate 102 may be a package substrate. The substrate 104 may be an interposer.

The substrate 104 is coupled to the substrate 102 through a plurality of solder interconnects 110. The substrate 102 includes at least one dielectric layer 120 and a plurality of interconnects 122. The substrate 104 includes at least one dielectric layer 140 and a plurality of interconnects 142. The plurality of solder interconnects 110 is coupled to the plurality of interconnects 122 and the plurality of interconnects 142. The integrated device 103 is coupled to a first surface (e.g., top surface) of the substrate 104 through a plurality of solder interconnects 130. The integrated device stack 101 is coupled to the first surface of the substrate 104 through a plurality of solder interconnects 150.

Figure 2:
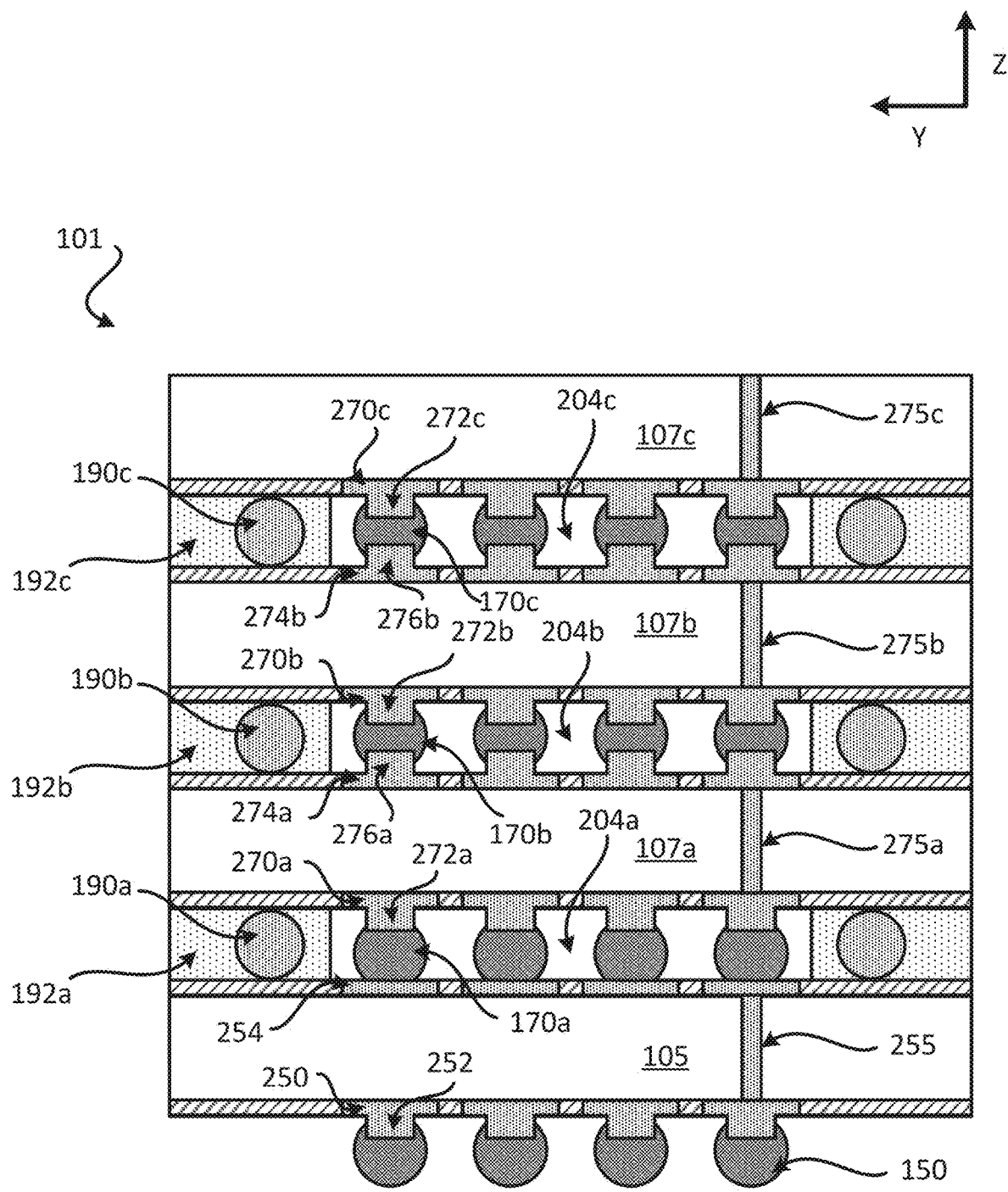
FIG. 2 illustrates a cross sectional profile view of a package that includes a first integrated device coupled to a second integrated device with spacer balls between the first integrated device and the second integrated device.

FIG. 2 illustrates a close up view of the integrated device stack 101 (e.g., stack of integrated devices, vertical stack of integrated devices) that includes a plurality of integrated devices. The integrated device stack 101 may be a package that includes several integrated devices. The integrated device stack 101 includes integrated devices that are stacked on top of each other (e.g., vertically stacked integrated devices). The integrated device stack 101 includes an integrated device 105, an integrated device 107a, an integrated device 107b, and an integrated device 107c. The integrated device stack 101 includes a plurality of spacer balls 190a, a plurality of spacer balls 190b, a plurality of spacer balls 190c, a polymer layer 192a, a polymer layer 192b, a polymer layer 192c, an underfill 204a, an underfill 204b and an underfill 204c. As will be further described below, the plurality of spacer balls (e.g., 190a, 190b, 109c) are spacers that are located between integrated devices to help provide consistent and uniform gaps between integrated devices, which helps to ensure proper, robust and/or reliable joints (e.g., solder joints) between integrated devices.

As mentioned above, the integrated device stack 101 may be coupled to the substrate 104. The integrated device 105 may be coupled to the first surface of the substrate 104 through a plurality of solder interconnects 150.

The integrated device 107a is coupled to the integrated device 105 through a plurality of solder interconnects 170a. The plurality of spacer balls 190a, the polymer layer 192a and the underfill 204a are located between the integrated device 105 and the integrated device 107a. The integrated device 107b is coupled to the integrated device 107a through a plurality of solder interconnects 170b. The plurality of spacer balls 190b, the polymer layer 192b and the underfill 204b are located between the integrated device 107b and the integrated device 107a. The integrated device 107c is coupled to the integrated device 107b through a plurality of solder interconnects 170c. The plurality of spacer balls 190c, the polymer layer 192c and the underfill 204c are located between the integrated device 107c and the integrated device 107b.

The integrated device 105 includes a plurality of pad interconnects 250, a plurality of pillar interconnects 252, a plurality of pad interconnects 254, and a plurality of interconnects 255. The plurality of pad interconnects 250, the plurality of pillar interconnects 252, and/or the plurality of pad interconnects 254 may be examples of a plurality of interconnects for the integrated device 105. The plurality of interconnects 255 is coupled to the plurality of pad interconnects 250 and the plurality of pad interconnects 254. The plurality of interconnects 255 may include a plurality of die interconnects and/or a plurality of through substrate vias.

The integrated device 107a includes a plurality of pad interconnects 270a, a plurality of pillar interconnects 272a, a plurality of pad interconnects 274a, a plurality of pillar interconnects 276a and a plurality of interconnects 275a. The plurality of pad interconnects 270a, the plurality of pillar interconnects 272a, the plurality of pad interconnects 274a, and/or the plurality of pillar interconnects 276a may be examples of a plurality of interconnects for the integrated device 107a. The plurality of interconnects 275a is coupled to the plurality of pad interconnects 270a and the plurality of pad interconnects 274a. The plurality of interconnects 275a may include a plurality of die interconnects and/or a plurality of through substrate vias.

The integrated device 107b includes a plurality of pad interconnects 270b, a plurality of pillar interconnects 272b, a plurality of pad interconnects 274b, a plurality of pillar interconnects 276b and a plurality of interconnects 275b. The plurality of pad interconnects 270b, the plurality of pillar interconnects 272b, the plurality of pad interconnects 274b, and/or the plurality of pillar interconnects 276b may be examples of a plurality of interconnects for the integrated device 107b. The plurality of interconnects 275b is coupled to the plurality of pad interconnects 270b and the plurality of pad interconnects 274b. The plurality of interconnects 275b may include a plurality of die interconnects and/or a plurality of through substrate vias.

The integrated device 107c includes a plurality of pad interconnects 270c, a plurality of pillar interconnects 272c and a plurality of interconnects 275c. The plurality of pad interconnects 270c and the plurality of pillar interconnects 272c may be examples of a plurality of interconnects for the integrated device 107c. The plurality of interconnects 275c may be coupled to the plurality of pad interconnects 270c. The plurality of interconnects 275c may include a plurality of die interconnects and/or a plurality of through substrate vias.

The plurality of solder interconnects 150 is coupled to the plurality of pillar interconnects 252. The plurality of solder interconnects 170a is coupled to the plurality of pad interconnects 254 and the plurality of pillar interconnects 272a. The plurality of solder interconnects 170b is coupled to the plurality of pillar interconnects 276a and the plurality of pillar interconnects 272b. The plurality of solder interconnects 170c is coupled to the plurality of pillar interconnects 276b and the plurality of pillar interconnects 272c.

In some implementations, the integrated device 105 may include a logic die (e.g., logic semiconductor die). In some implementations, the integrated device 107a may include a memory die (e.g., memory semiconductor die). In some implementations, the integrated device 107b may include a memory die (e.g., memory semiconductor die). In some implementations, the integrated device 107c may include a memory die (e.g., memory semiconductor die).

An integrated device may include a die substrate (e.g., silicon substrate), a plurality of through substrate vias (TSVs), a plurality of transistors and/or logic cells (not shown), a plurality of die dielectric layers and a plurality of die interconnects. The plurality of transistors and/or logic cells may be formed in and/or over the die substrate. A front end of line (FEOL) process may be used to form the plurality of transistors and/or logic cells in and over the die substrate. The plurality of die dielectric layers and the plurality of die interconnects may be formed over the die substrate and the plurality of transistors and/or logic cells. A back end of line (BEOL) process may be used to form the plurality of die dielectric layers and the plurality of die interconnects. The plurality of die interconnects may be coupled to the plurality of transistors and/or logic cells. The plurality of die interconnects may be coupled to the plurality of through substrate vias (TSVs). It is noted that the plurality of interconnects 275 (e.g., 275a, 275b, 275c) may conceptually illustrate interconnects that may be located in an integrated device. For example, the plurality of interconnects 275 (e.g., 275a, 275b, 275c) of an integrated device may conceptually represent one or more through substrate vias (TSVs) and/or one or more die interconnects of an integrated device. An integrated device may include a front side and a back side. The back side of the integrated device may include the side or surface that includes the die substrate. The front side of the integrated device may be a side that is opposite to the back side. As shown in FIG. 2, an integrated device may include a plurality of interconnects that are located on a back side surface of the integrated devices. The plurality of interconnects that are located on the back side surface of the integrated device may be a plurality of back side surface interconnects. The plurality of back side surface interconnects may include a plurality of pillar interconnects (e.g., back side surface pillar interconnects) and/or a plurality of pad interconnects (e.g., back side surface pad interconnects).

In one example, the plurality of pad interconnects 250 and the plurality of pillar interconnects 252 may be considered front side interconnects for the integrated device 105, and the plurality of pad interconnects 254 may be considered back side interconnects for the integrated device 105.

In one example, the plurality of pad interconnects 250 and the plurality of pillar interconnects 252 may be considered back side interconnects for the integrated device 105, and the plurality of pad interconnects 254 may be considered front side interconnects for the integrated device 105.

In one example, the plurality of pad interconnects 270a and the plurality of pillar interconnects 272a may be considered front side interconnects for the integrated device 107a, and the plurality of pad interconnects 274a and the plurality of pillar interconnects 276a may be considered back side interconnects for the integrated device 107a. In one example, the plurality of pad interconnects 270a and the plurality of pillar interconnects 272a may be considered back side interconnects for the integrated device 107a, and the plurality of pad interconnects 274a and the plurality of pillar interconnects 276a may be considered front side interconnects for the integrated device 107a.

In one example, the plurality of pad interconnects 270b and the plurality of pillar interconnects 272b may be considered front side interconnects for the integrated device 107b, and the plurality of pad interconnects 274b and the plurality of pillar interconnects 276b may be considered back side interconnects for the integrated device 107b. In one example, the plurality of pad interconnects 270b and the plurality of pillar interconnects 272b may be considered back side interconnects for the integrated device 107b, and the plurality of pad interconnects 274b and the plurality of pillar interconnects 276b may be considered front side interconnects for the integrated device 107b.

In one example, the plurality of pad interconnects 270c and the plurality of pillar interconnects 272c may be considered front side interconnects for the integrated device 107c. In one example, the plurality of pad interconnects 270c and the plurality of pillar interconnects 272c may be considered back side interconnects for the integrated device 107c.

Figure 3:
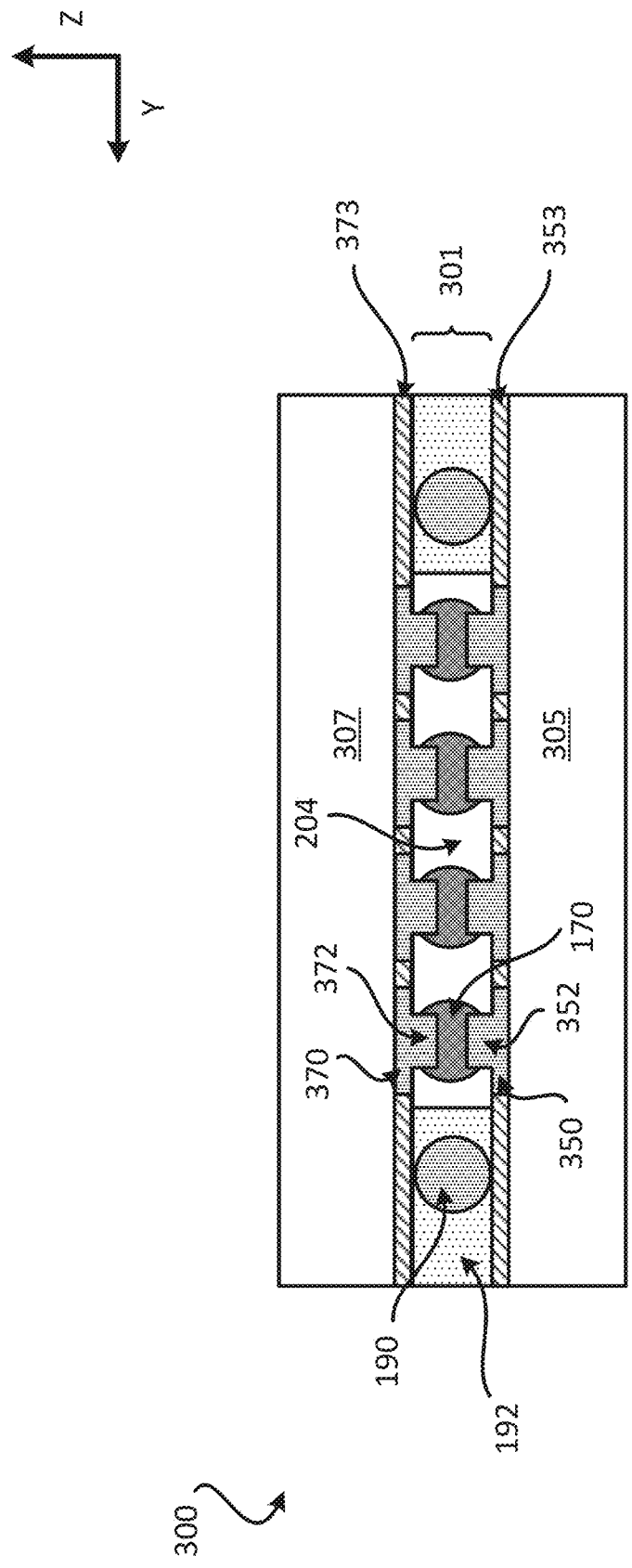
FIG. 3 illustrates a cross sectional profile view of a package that includes a first integrated device coupled to a second integrated device with spacer balls between the first integrated device and the second integrated device.

FIG. 3 illustrates a package 300 that includes an integrated device 305 (e.g., first integrated device, first die) and an integrated device 307 (e.g., second integrated device, second die). The package 300 illustrates an example of integrated device to integrated device coupling (e.g., die to die coupling). The integrated device 305 is coupled to the integrated device 307 through the plurality of solder interconnects 170. The integrated device 305 includes the passivation layer 353, the plurality of pad interconnects 350 and the plurality of pillar interconnects 352. The integrated device 307 includes the passivation layer 373, the plurality of pad interconnects 370 and the plurality of pillar interconnects 372. The plurality of solder interconnects 170 is coupled to the plurality of pillar interconnects 352 and the plurality of pillar interconnects 372. There is an underfill 204 between the integrated device 305 and the integrated device 307. The underfill 204 may laterally surround the plurality of solder interconnects 170, the plurality of pillar interconnects 352 and/or the plurality of pillar interconnects 372.

A plurality of spacer balls 190 (e.g., spacers) and a polymer layer 192 are located between the integrated device 305 and the integrated device 307. The plurality of spacer balls 190 may be located at least partially in the polymer layer 192. The plurality of spacer balls 190 and the polymer layer 192 are located along a periphery of the integrated device 305, the integrated device 307 and/or the package 300.

In some implementations, a pitch between neighboring solder interconnects from the plurality of solder interconnects 170 is about 5-20 micrometers. In some implementations, a pitch between neighboring pillar interconnects from the plurality of pad interconnects 350 is about 5-20 micrometers. In some implementations, a pitch between neighboring pillar interconnects from the plurality of pillar interconnects 352 is about 5-20 micrometers. In some implementations, a pitch between neighboring pillar interconnects from the plurality of pad interconnects 370 is about 5-20 micrometers. In some implementations, a pitch between neighboring pillar interconnects from the plurality of pillar interconnects 372 is about 5-20 micrometers. In some implementations, the plurality of spacer balls 190 (e.g., spacers) may have a diameter of about 5-20 micrometers.

There is a gap 301 between the passivation layer 353 of the integrated device 305 and the passivation layer 373 of the integrated device 307. The gap 301 may be represent a bond line thickness (BLT) between the integrated device 305 and the integrated device 307. The gap 301 is provided through the use of the plurality of spacer balls 190 (e.g., spacers). The plurality of spacer balls 190 helps provide a uniform, a constant or substantially constant gap between the integrated device 305 and the integrated device 307. This in turn, helps ensure that there are robust and reliable joints between the integrated device 305 and the integrated device 307. In some implementations, the gap 301 may be about 5-20 micrometers.

FIG. 3 illustrates an example of front side to front side coupling of integrated devices. That is, the front side of the first integrated device is coupled to the front side of the second integrated device. However, two integrated devices may be coupled together through front side to back side coupling, where the front side of an integrated device is coupled to a back side of another integrated device. In another example, two integrated devices may be coupled together through back side to back side coupling, where the back side of an integrated device is coupled to a back side of another integrated device. The integrated device stack 101 (e.g., stack of integrated devices) of FIGS. 1 and 2 may include integrated devices that are coupled to each other through front side to front side coupling, front side to back side coupling, back side to front side coupling and/or back side to back side coupling.

For purposes of clarity, it is noted that the package 300 does not necessarily illustrate all of the components of an integrated device. For example, the integrated device 305 and/or the integrated devices 307 may each include other components, such as a die substrate (e.g., silicon substrate), a plurality of transistors and/or logic cells, a plurality of die interconnects, at least one die dielectric layer, a plurality of through substrate vias, and/or a plurality of back side interconnects (e.g., back side pad interconnects, back side pillar interconnects). The plurality of through substrate vias may be coupled to the plurality of die interconnects. The plurality of through substrate vias may be coupled to the plurality of back side interconnects. The plurality of die interconnects may be coupled to the plurality of pads interconnects. The integrated device 305 and/or the integrated device 307 may be similar or the same as the integrated devices 105, 107a, 107b and/or 107c of FIGS. 1 and 2.

Figure 4:
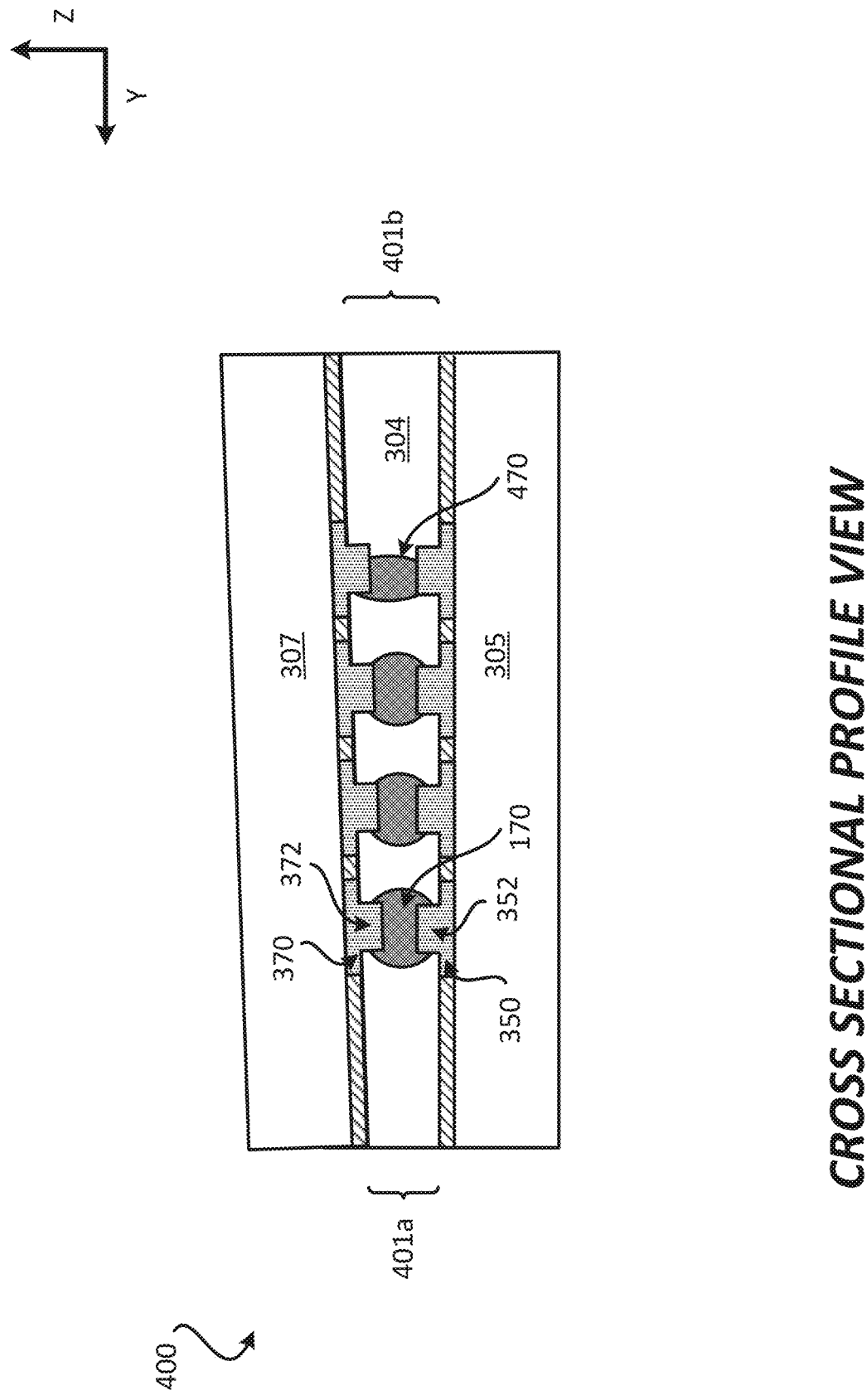
FIG. 4 illustrates a cross sectional profile view of a package that includes a first integrated device coupled to a second integrated device without spacer balls between the first integrated device and the second integrated device.

FIG. 4 illustrates an example of what can occur when the is integrated device to integrated device coupling without the use of spacer balls. FIG. 4 illustrates a package 400 that is similar to the package 300. However, the package 400 does not include any spacer balls. During the coupling process of the integrated device 307 to the integrated device 305, it is possible that there is more pressure that is applied to one side of the integrated device, resulting in one side of the package 400 to have a gap 401 a and another side of the package 400 to have a gap 401b. The gap 401b is greater than the gap 401a. The difference in gaps and/or the variations in gaps can result in poor or open joints between the integrated device 305 and the integrated device 307. For example, the solder interconnect 470 between the integrated device 305 and the integrated device 307 is not as robust or reliable as the solder interconnects 170 because the solder interconnect 470 has been stretched out due to the higher gap 401b between the integrated device 305 and the integrated device 307. The plurality of spacer balls 190 helps ensure such variations in the gap are minimized, reduced and/or eliminated.

Figure 5:
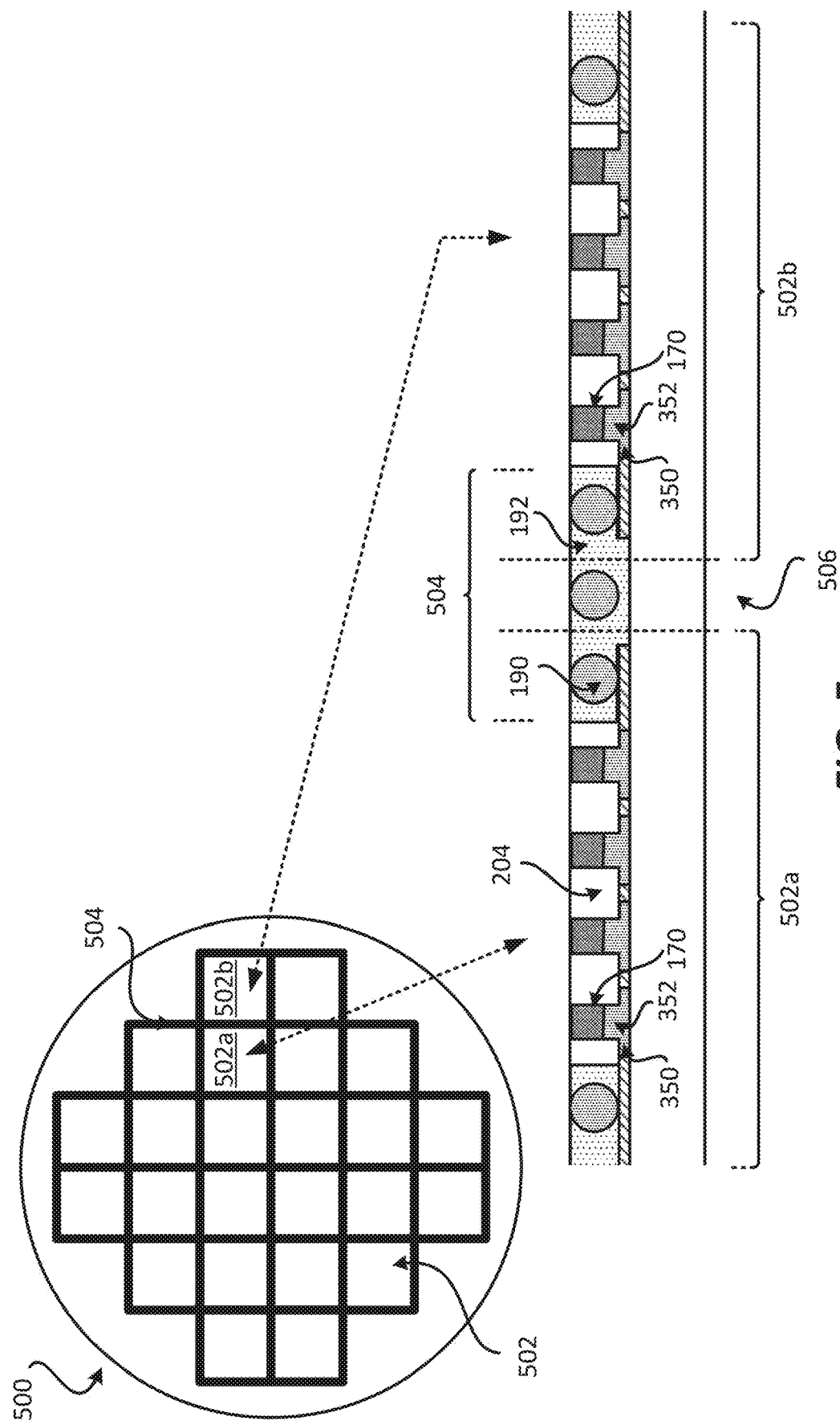
FIG. 5 illustrates a wafer that includes several integrated devices with a polymer layer and spacer balls.

FIG. 5 illustrates a wafer 500 that includes a plurality of integrated device 502 (e.g., uncut integrated devices). The plurality of integrated device 502 are fabricated at the same time and then singulated later in the fabrication process. The plurality of integrated device 502 includes the integrated device 502a and the integrated device 502b. The plurality of integrated device 502 may be separated by a cut region 504. The cut region 504 may be a region of the wafer 500 that can be filled with a plurality of spacer balls 190 and polymer layer 192. The cut region 504 may include cut line 506, which is the part of the wafer that is cut or remove to singulate the integrated devices. The plurality of spacer balls 190 may be located at least partially in the polymer layer 192. The polymer layer 192 may include an adhesive. The polymer layer 192 helps position the spacer balls 190 in the proper regions between uncut integrated devices. The plurality of spacer balls 190 may include particles that include mono-dispersed particles, silica, glass, polymer, ceramic, and/or metal. For example, the plurality of spacer balls 190 may include polyethylene polymer particles. The underfill 204 (e.g., non-conductive film (NCF) underfill, wafer level underfill (WLUF)) may laterally surround the plurality of solder interconnects 170 and/or the plurality of pillar interconnects 352.

An integrated device (e.g., 105, 107, 305, 307) may include a die (e.g., semiconductor bare die). An integrated device may include a die substrate (e.g., silicon substrate), a plurality of transistors and/or logic cells, a plurality of die interconnects, and a plurality of pad interconnects. The integrated device may include a logic die, a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, a power management processor (e.g., power management integrated circuit (PMIC)), and/or combinations thereof. An integrated device (e.g., 105, 107, 305, 307) may include at least one electronic circuit (e.g., first electronic circuit, second electronic circuit, etc. . . . ). In some implementations, an integrated device may be a chiplet. A chiplet may provide better yield during fabrication, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that performs several functions may reduce the overall cost of a package relative to using a single chip to perform all of the functions of a package.

Having describe various package with integrated device to integrated device coupling with a plurality of spacers (e.g., spacer balls) between integrated devices, a process for fabricating a package that includes integrated device to integrated device coupling will now be described below.

Figure 6A:
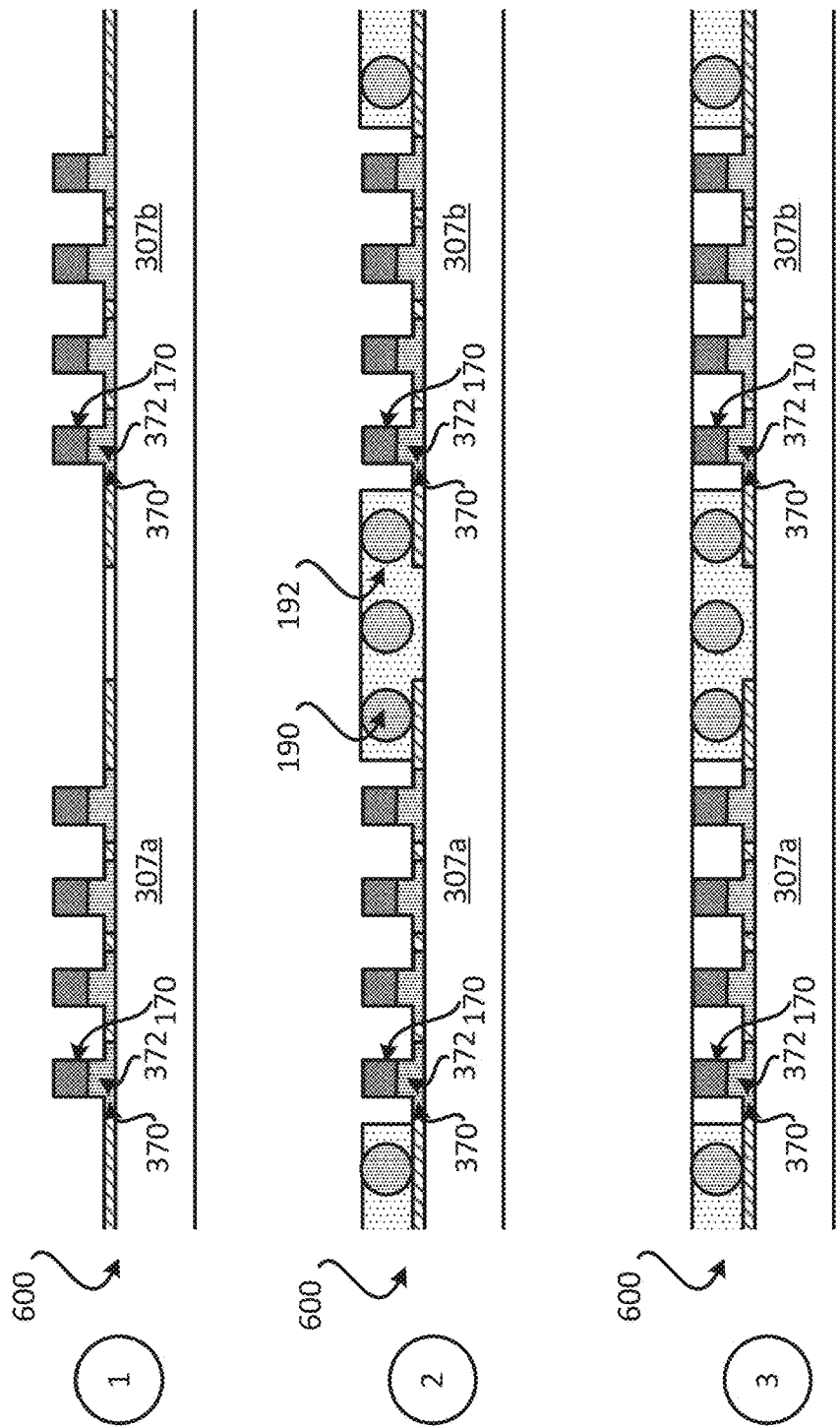
FIGS. 6A-6B illustrate an exemplary sequence for fabricating a package that includes a first integrated device coupled to a second integrated device with spacer balls between the first integrated device and the second integrated device.
Figure 6B:
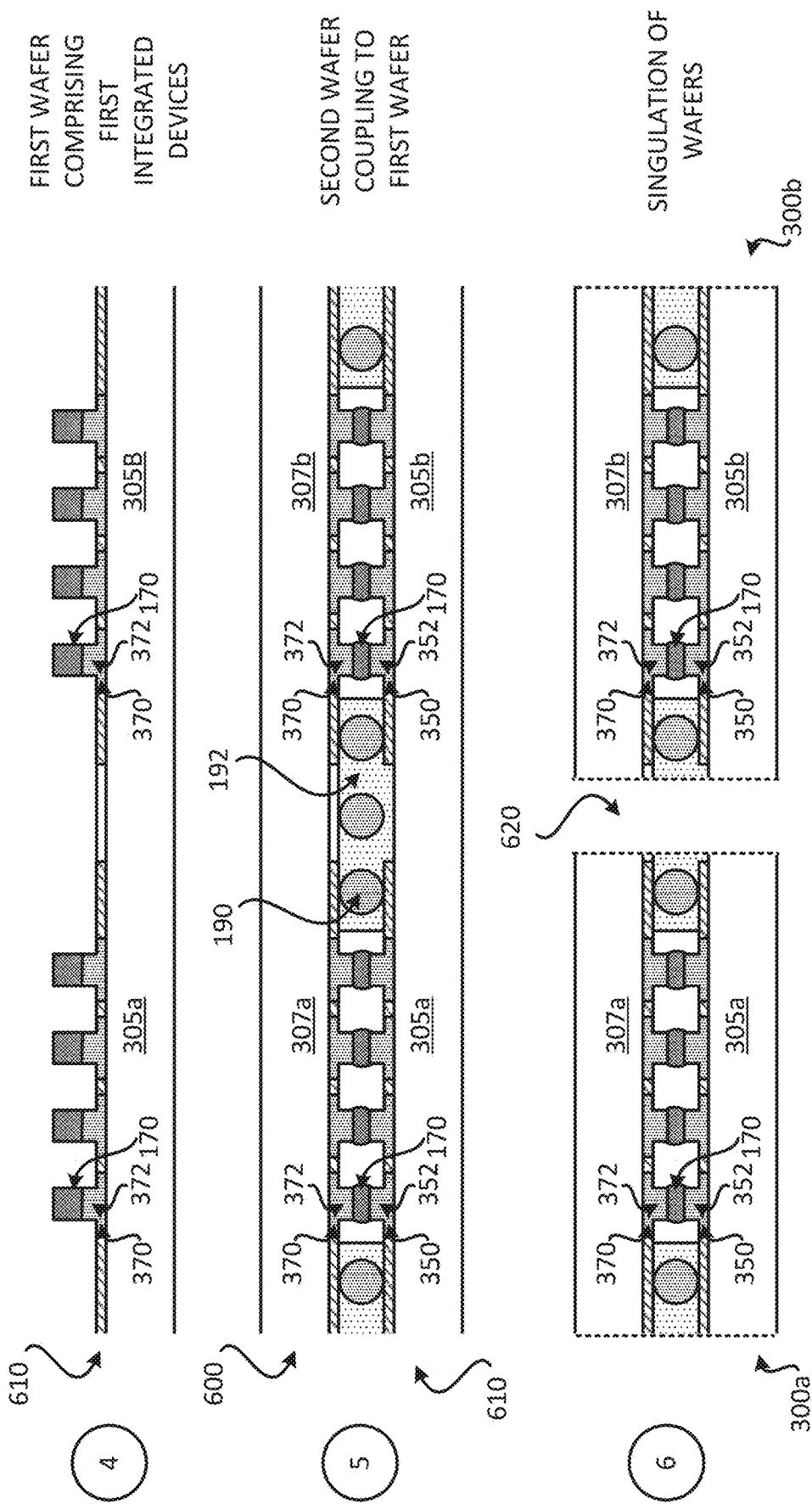

Exemplary Sequence for Fabricating a Package Comprising Integrated Device to Integrated Device Coupling with Spacers Between Integrated Devices FIGS. 6A-6B illustrate an exemplary sequence for providing or fabricating a package. In some implementations, the sequence of FIGS. 6A-6B may be used to provide or fabricate the package 300 of FIG. 3, or any of the packages described in the disclosure.

It should be noted that the sequence of FIGS. 6A-6B may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. Different implementations may fabricate a package differently. The sequence of FIGS. 6A-6B illustrates an example of fabricating two packages together. However, the sequence of FIGS. 6A-6B may be used to fabricate more than two packages that are vertically stacked on top of each other.

Figure 8A:
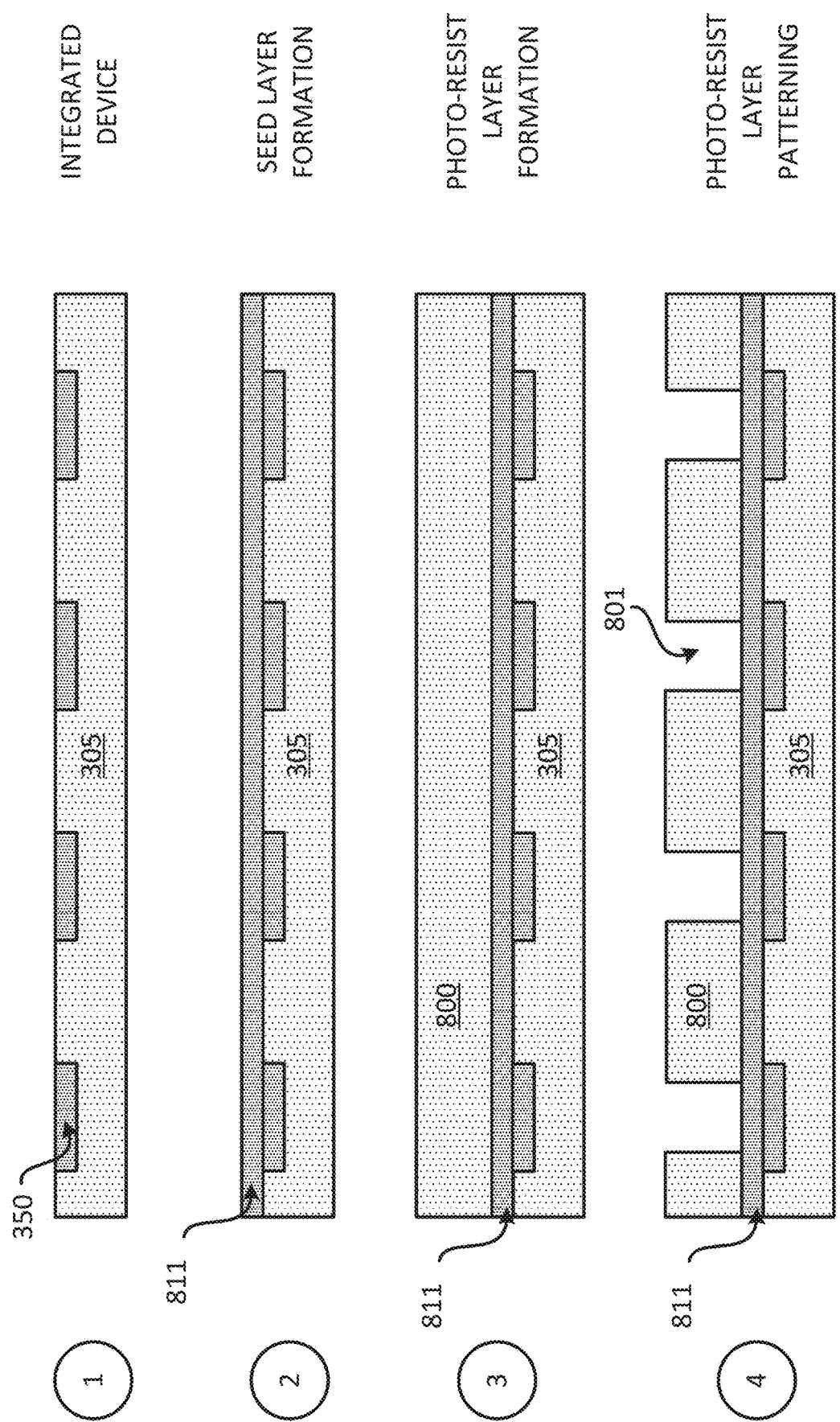
FIGS. 8A-8B illustrate an exemplary sequence for fabricating an integrated device with pillar interconnects.
Figure 8B:
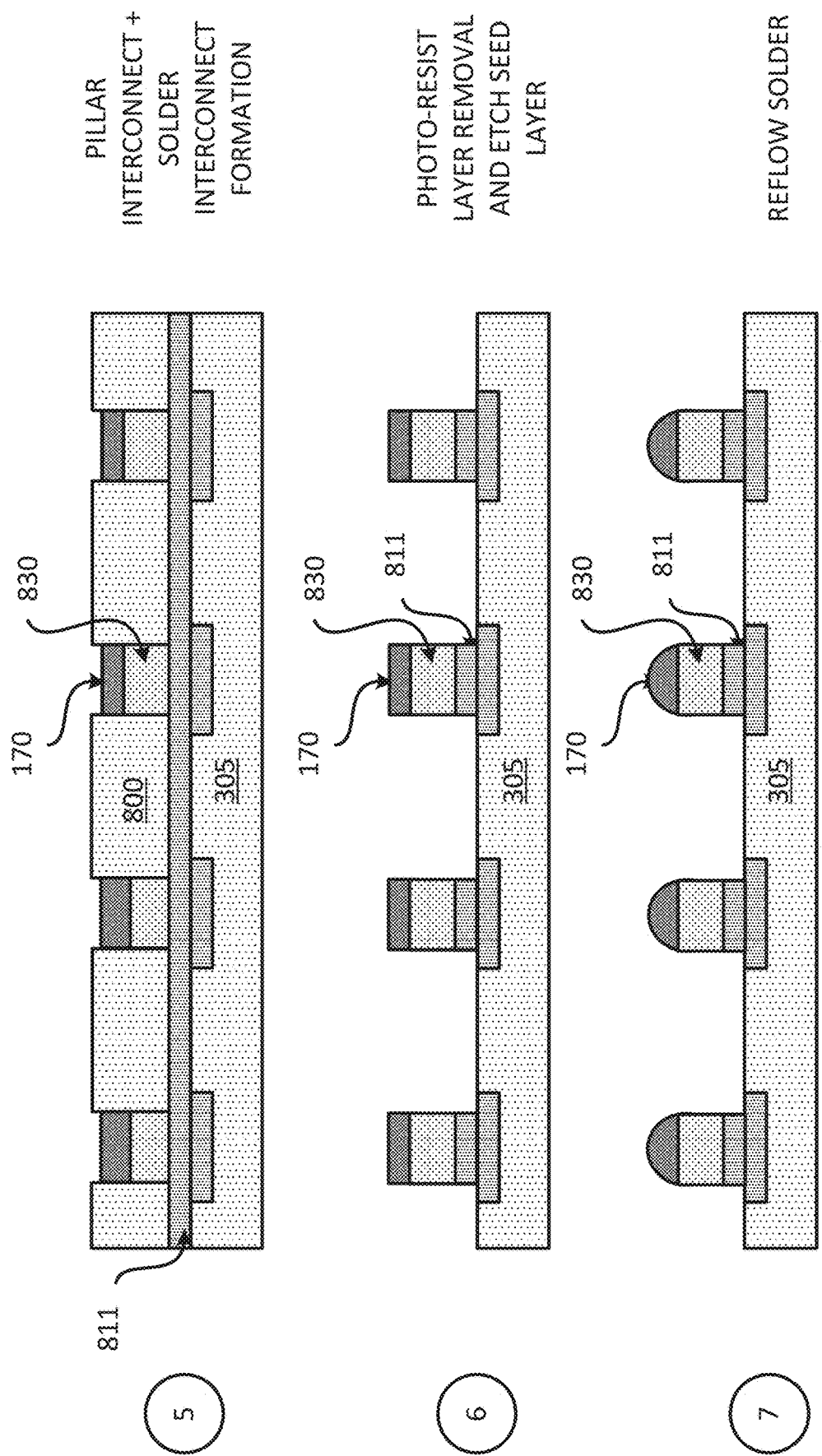

Stage 1, as shown in FIG. 6A, illustrates a state after a wafer 600 that includes an integrated device 307a and an integrated device 307b. The integrated device 307a and the integrated device 307b are uncut integrated devices from a plurality of integrated devices of the wafer 600. Each integrated device may include a plurality of pad interconnects 370, a plurality of pillar interconnects 372 and a plurality of solder interconnects 170. The wafer 600 may be a second wafer that includes a plurality of second integrated devices. FIGS. 8A-8B illustrate an example of a process that may be used to form a wafer that includes integrated devices.

Stage 2 illustrates a state after a plurality of spacer balls 190 and a polymer layer 192 are provided over the wafer 600 such that the plurality of spacer balls 190 and the polymer layer 192 are located between the uncut integrated devices. For example, the plurality of spacer balls 190 and the polymer layer 192 may be provided in the cut region 504 of the wafer. The cut region 504 may be a region that is cut in order to singulate the integrated devices of the wafer 600. The polymer layer 192 may include an adhesive layer to help the spacer balls to be positioned in the proper region of the wafer 600.

Stage 3 illustrates a state after an underfill 204 is formed over the integrated devices (e.g., uncut integrated devices) of the wafer 600 such that the underfill may laterally surround the plurality of pillar interconnects 372 and/or the plurality of solder interconnects 170.

Stage 4, as shown in FIG. 6B, illustrates a state after a wafer 610 that includes an integrated device 305a and an integrated device 305b. The integrated device 305a and the integrated device 305b are uncut integrated devices from a plurality of integrated devices of the wafer 610. Each integrated device may include a plurality of pad interconnects 350, a plurality of pillar interconnects 352 and a plurality of solder interconnects 170. The wafer 610 may be a first wafer that includes a plurality of first integrated devices. FIGS. 8A-8B illustrate an example of a process that may be used to form a wafer that includes integrated devices.

Stage 5 illustrates a state after the wafer 600 is coupled to the wafer 610. A solder reflow process may be used to couple the wafer 600 to the wafer 610. The wafer 600 (comprising integrated devices 307) is coupled to the wafer 610 (comprising integrated devices 305) through the plurality of solder interconnects 170. The plurality of spacer balls 190 helps ensure uniform or near uniform gap between the wafer 600 and the wafer 610.

Stage 6 illustrates after a state after the wafer 600 and the wafer 610 are singulated to create a plurality of packages comprising integrated device to integrated device coupling. The wafer 600 and the wafer 610 may be cut along a cut line 620. After singulation, the package 300a and the package 300b may be formed. A mechanical process (e.g., saw) or a laser process may be use to singulate the wafers. In some implementations, before singulation, additional wafers may be coupled to form a package that includes more than two integrated devices, such as described in FIG. 2.

Figure 7:
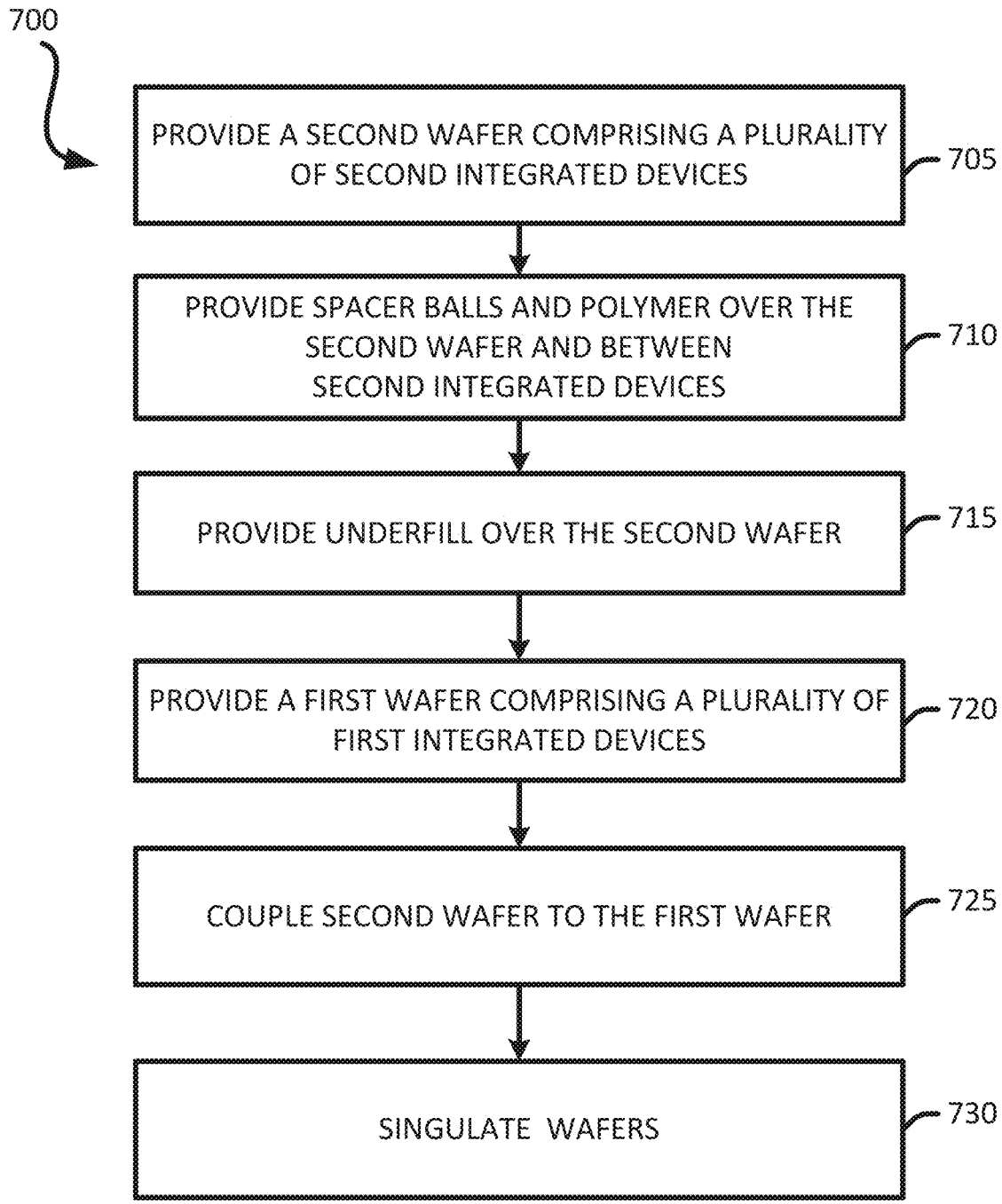
FIG. 7 illustrates an exemplary flow diagram of a method for fabricating a package that includes a first integrated device coupled to a second integrated device with spacer balls between the first integrated device and the second integrated device.

Exemplary Flow Diagram of a Method for Fabricating a Package Comprising Integrated Device to Integrated Device Coupling with Spacers Between Integrated Devices In some implementations, fabricating a package includes several processes. FIG. 7 illustrates an exemplary flow diagram of a method 700 for providing or fabricating a package. In some implementations, the method 700 of FIG. 7 may be used to provide or fabricate the package 300 of FIG. 3 described in the disclosure. However, the method 700 may be used to provide or fabricate any of packages described in the disclosure.

It should be noted that the method of FIG. 7 may combine one or more processes in order to simplify and/or clarify the method for providing or a package with several integrated devices. In some implementations, the order of the processes may be changed or modified.

The method provides (at 705) a wafer that includes a plurality of integrated devices. For example, the method may provide a wafer 600 that includes a plurality of integrated devices. The plurality of integrated devices are uncut integrated devices. The wafer 600 may be a second wafer that includes a plurality of second integrated devices. Each uncut integrated device may include a plurality of pad interconnects 370, a plurality of pillar interconnects 372 and a plurality of solder interconnects 170. FIGS. 8A-8B illustrate an example of a process that may be used to form a wafer that includes integrated devices. Stage 1 of FIG. 6A illustrates and describes an example of providing a wafer that includes uncut integrated devices.

The method provides (at 710) a plurality of spacer balls 190 and a polymer layer 192 over the wafer (e.g., 600) such that the plurality of spacer balls 190 and the polymer layer 192 are located between the uncut integrated devices. For example, the plurality of spacer balls 190 and the polymer layer 192 may be provided in the cut region 504 of the wafer. The cut region 504 may be a region that is cut in order to singulate the integrated devices of the wafer (e.g., 600). The polymer layer 192 may include an adhesive layer to help the spacer balls to be positioned in the proper region of the wafer (e.g., 600). Stage 2 of FIG. 6A illustrates and describes an example of providing spacer balls and a polymer layer.

The method provides (at 715) an underfill (e.g., 204) over the integrated devices of the wafer (e.g., 600) such that the underfill may laterally surround the plurality of pillar interconnects 372 and/or the plurality of solder interconnects 170. Stage 3 of FIG. 6A illustrates and describes an example of providing an underfill.

The method provides (at 720) a wafer (e.g., 610) that includes a plurality of integrated devices. For example, the method may provide a wafer 610 that includes a plurality of integrated devices. The wafer 610 includes uncut integrated devices. Each uncut integrated device may include a plurality of pad interconnects 350, a plurality of pillar interconnects 352 and a plurality of solder interconnects 170. The wafer 610 may be a first wafer that includes a plurality of first integrated devices. FIGS. 8A-8B illustrate an example of a process that may be used to form a wafer that includes integrated devices. Stage 4 of FIG. 6B illustrates and describes an example of providing a wafer that includes uncut integrated devices.

The method couples (at 725) a second wafer (e.g., 600) to a first wafer (e.g., 610). A solder reflow process may be used to couple the second wafer to the first wafer. The second wafer (e.g., 600) comprising a plurality of second integrated devices may be coupled to the first wafer (e.g., 610) comprising a plurality of first integrated devices through a plurality of solder interconnects (e.g., 170). The plurality of spacer balls 190 helps ensure uniform or near uniform gap between the wafer 600 and the wafer 610. Stage 5 of FIG. 6B illustrates and describes an example of coupling wafers. In some implementations, additional wafers may be coupled to the coupled wafers.

The method singulates (at 730) the wafers to form singulated packages that includes several integrated devices with spacer balls and a polymer layer between integrated devices. A mechanical process (e.g., saw) or a laser process may be use to singulate the wafers. Stage 6 of FIG. 6B illustrates and describes an example of singulation of wafers.

Exemplary Sequence for Fabricating an Integrated Device with Pillar Interconnects FIGS. 8A-8B illustrate an exemplary sequence for providing or fabricating an integrated device with pillar interconnects. In some implementations, the sequence of FIGS. 8A-8B may be used to provide or fabricate the integrated devices (e.g., 305, 307) of FIG. 3, or any of the integrated devices described in the disclosure.

It should be noted that the sequence of FIGS. 8A-8B may combine one or more stages in order to simplify and/or clarify the sequence for providing or fabricating the integrated device. In some implementations, the order of the processes may be changed or modified. In some implementations, one or more of processes may be replaced or substituted without departing from the scope of the disclosure. Different implementations may fabricate an integrated device differently.

Stage 1, as shown in FIG. 8A, illustrates a state after an integrated device 305 is provided. The integrated device 305 may include a die (e.g., bare semiconductor die). The integrated device 305 may include a die substrate (e.g., silicon substrate) and a plurality of transistors (e.g., active devices). The integrated device 305 may include a plurality of pad interconnects 350. The integrated device 305 may include die interconnects and/or through substrate vias.

Stage 2 illustrates a state after a seed layer 811 is formed over the front side of the integrated device 305. The seed layer 811 may include a metal layer. The seed layer 811 may be deposited over the integrated device 305. A plating process may be used to form the seed layer 811.

Stage 3 illustrates a state after a photo-resist layer 800 is formed over the seed layer 811. The photo-resist layer 800 may be deposited over the seed layer 811.

Stage 4 illustrates a state after the photo-resist layer 800 is patterned, creating at least one opening 801 in the photo-resist layer 800 that exposes part of the seed layer 811.

Stage 5, as shown in FIG. 8B, illustrates a state after a plurality of pillar interconnects 830 and a plurality of solder interconnects 832 are formed over the seed layer 811, through openings 801 in the photo-resist layer 800. The plurality of pillar interconnects 830 may be formed over the seed layer 811 through a plating process. The plurality of solder interconnects 170 may be formed over the plurality of pillar interconnects 830 through a deposition process.

Stage 6 illustrates a state after the photo-resist layer 800 is removed, and part of the seed layer 811 is removed (e.g., etched). Removing the photo-resist layer 800 may include stripping the photo-resist layer 800.

Stage 7 illustrates a state after a reflow solder process that couples (e.g., bonds) the plurality of solder interconnects 170 to the plurality of pillar interconnects 830. Stage 7 may illustrate an integrated device (e.g., 305, 307) with pillar interconnects. The plurality of pillar interconnects 830 may represent the plurality of pillar interconnects 352. The seed layer 811 may be considered part of the pillar interconnect 830. Thus, the seed layer 811 and the plurality of pillar interconnect 830 may represent the plurality of pillar interconnects 352.

Figure 9:
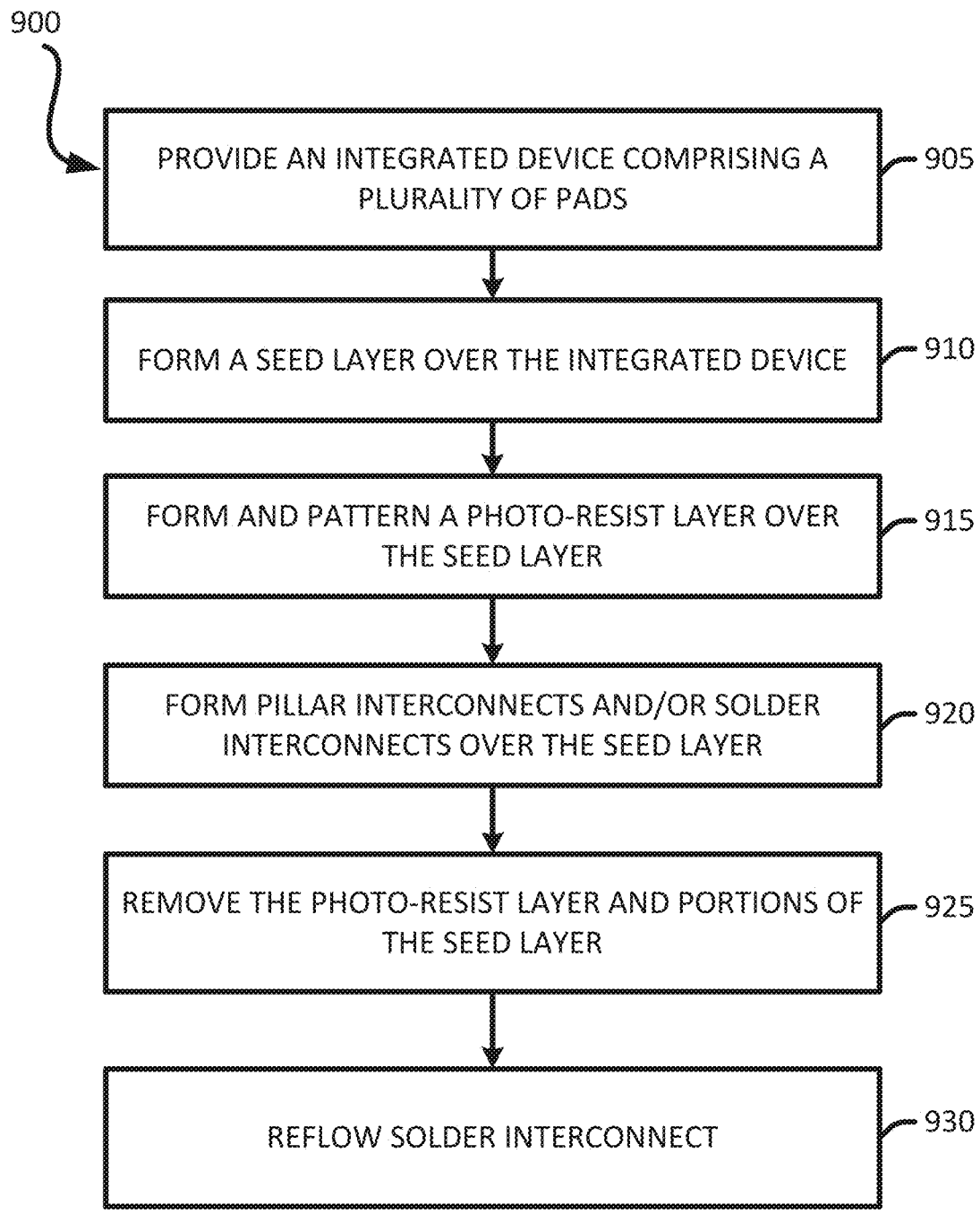
FIG. 9 illustrates an exemplary flow diagram of a method for fabricating an integrated device with pillar interconnects.

Exemplary Flow Diagram of a Method for Fabricating an Integrated Device Comprising Pillar Interconnects In some implementations, fabricating an integrated device with pillar interconnects includes several processes. FIG. 9 illustrates an exemplary flow diagram of a method 900 for providing or fabricating an integrated device with pillar interconnects. In some implementations, the method 900 of FIG. 9 may be used to provide or fabricate the integrated device (e.g., 305, 307) of FIG. 3 described in the disclosure. However, the method 900 may be used to provide or fabricate any of integrated devices described in the disclosure.

It should be noted that the method 900 of FIG. 9 may combine one or more processes in order to simplify and/or clarify the method for providing or fabricating an integrated device with pillar interconnects. In some implementations, the order of the processes may be changed or modified.

The method provides (at 905) an integrated device (e.g., 305, 307). Stage 1 of FIG. 8A illustrates and describes an integrated device 305 that is provided. The integrated device 305 may include a die with active devices, such as transistors. The integrated device may include a plurality of pad interconnects. The integrated device may include a die substrate, die interconnects and/or through substrate vias.

The method forms (at 910) a seed layer (e.g., 811) over a front side of the integrated device. The seed layer 811 may include a metal layer. The seed layer 811 may be deposited over the integrated device 305. A plating process may be used to form the seed layer 811. Stage 2 of FIG. 8A illustrates and describes an example of forming a seed layer.

The method forms (at 915) a photo-resist layer (e.g., 800) over the seed layer (e.g., 811). The photo-resist layer 800 may be formed and patterned over the seed layer 811. The photo-resist layer 800 may be deposited over the seed layer 811 and patterned, creating at least one opening 801 in the photo-resist layer 800 that exposes part of the seed layer 811. Stages 3-4 of FIG. 8A illustrate and describe an example of forming and patterning a photo-resist layer over a seed layer.

The method forms (at 920) a plurality of pillar interconnects (e.g., 830) and/or solder interconnects (e.g., 170) over the seed layer (e.g., 811) through openings 801 in the photo-resist layer (e.g., 800). The plurality of pillar interconnects may be formed over the seed layer through a plating process. The plurality of solder interconnects may be formed over the plurality of pillar interconnects through a deposition process and/or printing process. Stage 5 of FIG. 8B illustrates and describes an example of forming a plurality of pillar interconnects and/or a plurality of solder interconnects.

The method removes (at 925) a photo-resist layer (e.g., 800). Removing the photo-resist layer may include stripping the photo-resist layer. Stage 6 of FIG. 8B illustrate examples of removing a photo-resist layer. In some implementations, portions of a seed layer 811 may also be removed (at 925). An etching process may be used to remove portions of the seed layer. Stage 6 of FIG. 8B illustrates and describes an example of a portion of a seed layer that is removed. It is noted that forming a photo-resist layer, pillar interconnects and/or solder interconnects and removing the photo-resist layer, as described at 915, 920, and 925, may be repeated.

The method performs (at 930) a reflow solder process that couples (e.g., bonds) the plurality of solder interconnects (e.g., 170) to the plurality of pillar interconnects (e.g., 830). The plurality of pillar interconnects 830 and/or the seed layer 811 may represent the plurality of pad interconnects 350. Stage 7 of FIG. 8B illustrates and describes an example of a reflow solder process.

In some implementations, the integrated device is part of a wafer, and singulation may be performed to cut the wafer into individual integrated devices. The method 900 may be used to fabricate any integrated device described in the disclosure.

Exemplary Electronic Devices

Figure 10:
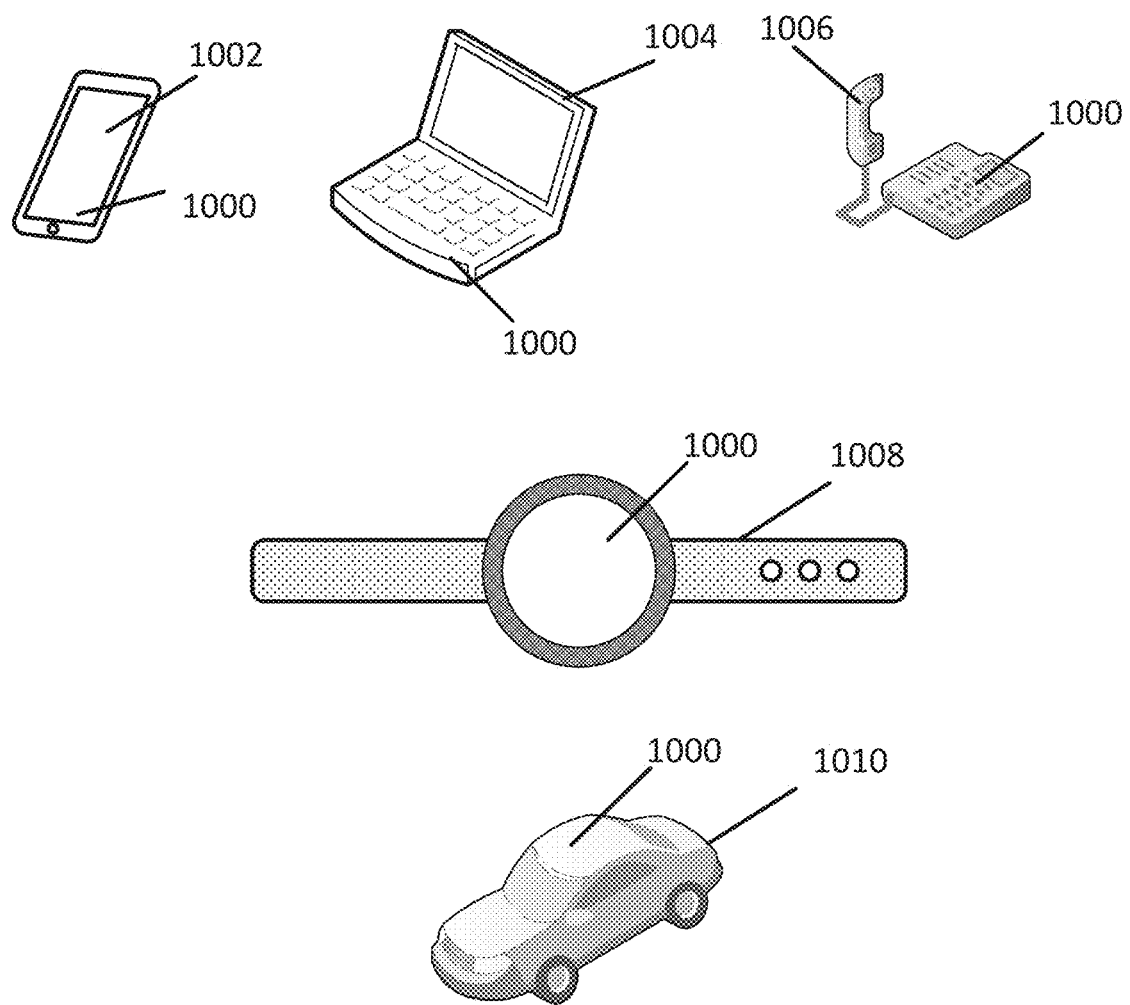
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-5, 6A-6B, 7, 8A-8B, and/or 9-10 may be rearranged and/or combined into a single component, process, feature or function or embodied in several components, processes, or functions. Additional elements, components, processes, and/or functions may also be added without departing from the disclosure. It should also be noted FIGS. 1-5, 6A-6B, 7, 8A-8B, and/or 9-10 and its corresponding description in the present disclosure is not limited to dies and/or ICs. In some implementations, FIGS. 1-5, 6A-6B, 7, 8A-8B, and/or 9-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X' For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The following provides an overview of aspects of the present disclosure:

Aspect 1: A package comprising a first integrated device comprising a first plurality of interconnects; a plurality of solder interconnects coupled to the first plurality of interconnects; a second integrated device comprising a second plurality of interconnects, wherein the second integrated device is coupled to the first integrated device through the second plurality of interconnects, the plurality of solder interconnects and the first plurality of interconnects; a polymer layer located between the first integrated device and the second integrated device; and a plurality of spacer balls located between the first integrated device and the second integrated device.

Aspect 2: The package of aspect 1, wherein the polymer layer comprises an adhesive layer.

Aspect 3: The package of aspects 1 through 2, wherein the plurality of spacer balls is located at least partially in the polymer layer.

Aspect 4: The package of aspects 1 through 3, wherein the plurality of spacer balls includes particles that include mono-dispersed particles, silica, glass, polymer, ceramic, and/or metal.

Aspect 5: The package of aspects 1 through 3, wherein the plurality of spacer balls includes polyethylene polymer particles.

Aspect 6: The package of aspects 1 through 5, further comprising an underfill between the first integrated device and the second integrated device.

Aspect 7: The package of aspects 1 through 6, wherein a pitch between neighboring interconnects from the first plurality of interconnects is about 20 micrometers or less.

Aspect 8: The package of aspects 1 through 7, wherein a pitch between neighboring solder interconnects from the plurality of solder interconnects is about 20 micrometers or less.

Aspect 9: The package of aspects 1 through 8, wherein the first plurality of interconnects includes a first plurality of pillar interconnects, and wherein the second integrated device is coupled to the first integrated device through the second plurality of interconnects, the plurality of solder interconnects and the first plurality of pillar interconnects.

Aspect 10: The package of aspects 1 through 9, wherein the first integrated device includes a first die, and wherein the second integrated device includes a second die.

Aspect 11: The package of aspects 1 through 10, wherein the first integrated device includes a first memory die, and wherein the second integrated device includes a logic die or a second memory die.

Aspect 12: The package of aspects 1 through 11, further comprising: a third integrated device comprising a third plurality of interconnects; a second polymer layer located between the third integrated device and the second integrated device; and a second plurality of spacer balls located between the third integrated device and the second integrated device.

Aspect 13: The package of aspect 12, wherein the third integrated device is coupled to the second integrated device through the third plurality of interconnects and a second plurality of solder interconnects.

Aspect 14: The package of aspect 12, wherein the second integrated device includes a plurality of through substrate vias.

Aspect 15: The package of aspects 1 through 14, wherein the first plurality of interconnects includes a first plurality of pillar interconnects and/or a first plurality of pad interconnects, and wherein the second plurality of interconnects includes a second plurality of pillar interconnects and/or a second plurality of pad interconnects.

Aspect 16: The package of aspects 1 through 15, wherein the first integrated device includes a third plurality of interconnects, wherein the first plurality of interconnects is located on a first surface of the first integrated device, and wherein the third plurality of interconnects is located on a second surface of the first integrated device.

Aspect 17: The package of aspects 1 through 16, wherein the package is incorporated in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 18: A package comprising: a substrate; and a stack of integrated devices coupled to the substrate through a first plurality of solder interconnects. The stack of integrated devices comprises a first integrated device comprising a first plurality of interconnects; a second plurality of solder interconnects coupled to the first plurality of interconnects; a second integrated device comprising a second plurality of interconnects, wherein the second integrated device is coupled to the first integrated device through the second plurality of interconnects, the second plurality of solder interconnects and the first plurality of interconnects; a polymer layer located between the first integrated device and the second integrated device; and a plurality of spacer balls located between the first integrated device and the second integrated device.

Aspect 19: The package of aspect 18, wherein the first integrated device from the stack of integrated devices is coupled to the substrate through the first plurality of solder interconnects.

Aspect 20: The package of aspects 18 through 19, wherein the plurality of spacer balls includes particles that include mono-dispersed particles, polyethylene polymer particles, silica, glass, polymer, ceramic, and/or metal.

Aspect 21: The package of aspects 18 through 20, further comprising an underfill between the first integrated device and the second integrated device.

Aspect 22: The package of aspect 18 through 21, wherein the first integrated device is coupled to the second integrated device through front side to front side coupling, front side to back side coupling, back side to front side coupling or back side to back side coupling.

Aspect 23: A method for fabricating a package, comprising: providing a second integrated device comprising a second plurality of interconnects and a plurality of solder interconnects coupled to the second plurality of interconnects; providing a polymer layer and a plurality of spacer balls over the second integrated device; and coupling a first integrated device comprising a first plurality of interconnects, to the second integrated device such that the second integrated device is coupled to the first integrated device through the second plurality of interconnects, the plurality of solder interconnects and the first plurality of interconnects, wherein the first integrated device is coupled to the second integrated device such that the polymer layer and the plurality of spacer balls are located between the first integrated device and the second integrated device.

Aspect 24: The method of aspect 23, wherein the polymer layer comprises an adhesive layer.

Aspect 25: The method of aspects 23 through 24, wherein the plurality of spacer balls includes particles that include mono-dispersed particles, polyethylene polymer particles, silica, glass, polymer, ceramic, and/or metal.

Aspect 26: The method of aspects 23 through 25, further comprising providing an underfill over the second integrated device, wherein the first integrated device is coupled to the second integrated device such that the underfill is located between the first integrated device and the second integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a first integrated device comprising a first plurality of interconnects;
a plurality of solder interconnects coupled to the first plurality of interconnects;
a second integrated device comprising a second plurality of interconnects, wherein the second integrated device is coupled to the first integrated device through the second plurality of interconnects, the plurality of solder interconnects and the first plurality of interconnects;
a polymer layer located between the first integrated device and the second integrated device;
a plurality of spacer balls located between the first integrated device and the second integrated device; and
an underfill at least partially surrounding the plurality of solder interconnects;
wherein a portion of the polymer layer at least partially surrounds the plurality of spacer balls and is laterally adjacent to the underfill and in direct contact with the underfill.

2. The package of claim 1, wherein the polymer layer comprises an adhesive layer.

3. The package of claim 1, wherein the plurality of spacer balls includes particles that include mono-dispersed particles, silica, glass, polymer, ceramic, and/or metal.

4. The package of claim 1, wherein the plurality of spacer balls includes polyethylene polymer particles.

5. The package of claim 1, wherein the underfill is located between the first integrated device and the second integrated device.

6. The package of claim 1, wherein a pitch between neighboring interconnects from the first plurality of interconnects is about 20 micrometers or less.

7. The package of claim 1, wherein a pitch between neighboring solder interconnects from the plurality of solder interconnects is about 20 micrometers or less.

8. The package of claim 1,
wherein the first plurality of interconnects includes a first plurality of pillar interconnects, and
wherein the second integrated device is coupled to the first integrated device through the second plurality of interconnects, the plurality of solder interconnects and the first plurality of pillar interconnects.

9. The package of claim 1,
wherein the first integrated device includes a first die, and
wherein the second integrated device includes a second die.

10. The package of claim 1,
wherein the first integrated device includes a first memory die, and
wherein the second integrated device includes a logic die or a second memory die.

11. The package of claim 1, further comprising:
a third integrated device comprising a third plurality of interconnects;
a second polymer layer located between the third integrated device and the second integrated device; and
a second plurality of spacer balls located between the third integrated device and the second integrated device.

12. The package of claim 11, wherein the third integrated device is coupled to the second integrated device through the third plurality of interconnects and a second plurality of solder interconnects.

13. The package of claim 11, wherein the second integrated device includes a plurality of through substrate vias.

14. The package of claim 1,
wherein the first plurality of interconnects includes a first plurality of pillar interconnects and/or a first plurality of pad interconnects, and
wherein the second plurality of interconnects includes a second plurality of pillar interconnects and/or a second plurality of pad interconnects.

15. The package of claim 1,
wherein the first integrated device includes a third plurality of interconnects,
wherein the first plurality of interconnects is located on a first surface of the first integrated device, and
wherein the third plurality of interconnects is located on a second surface of the first integrated device.

16. The package of claim 1, wherein the package is incorporated in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

17. The package of claim 1, wherein the polymer layer forms a first side wall and the underfill forms a second side wall and the first side wall and the second side wall are in direct contact.

18. A package comprising:
a substrate; and
a stack of integrated devices coupled to the substrate through a first plurality of solder interconnects, wherein the stack of integrated devices comprises:
  a first integrated device comprising a first plurality of interconnects;
  a second plurality of solder interconnects coupled to the first plurality of interconnects;
  a second integrated device comprising a second plurality of interconnects, wherein the second integrated device is coupled to the first integrated device through the second plurality of interconnects, the second plurality of solder interconnects and the first plurality of interconnects;
  a polymer layer located between the first integrated device and the second integrated device;
a plurality of spacer balls located between the first integrated device and the second integrated device; and
an underfill at least partially surrounding the plurality of solder interconnects;
wherein a portion of the polymer layer at least partially surrounds the plurality of spacer balls and is laterally adjacent to the underfill and in direct contact with the underfill.

19. The package of claim 18, wherein the first integrated device from the stack of integrated devices is coupled to the substrate through the first plurality of solder interconnects.

20. The package of claim 18, wherein the plurality of spacer balls includes particles that include mono-dispersed particles, polyethylene polymer particles, silica, glass, polymer, ceramic, and/or metal.

21. The package of claim 18, wherein the underfill is located between the first integrated device and the second integrated device.

22. The package of claim 18, wherein the first integrated device is coupled to the second integrated device through front side to front side coupling, front side to back side coupling, back side to front side coupling or back side to back side coupling.

23. A method for fabricating a package, comprising:
providing a second integrated device comprising a second plurality of interconnects and a plurality of solder interconnects coupled to the second plurality of interconnects;
providing an underfill at least partially surrounding the plurality of solder interconnects;
providing a polymer layer and a plurality of spacer balls over the second integrated device; and
coupling a first integrated device comprising a first plurality of interconnects, to the second integrated device such that the second integrated device is coupled to the first integrated device through the second plurality of interconnects, the plurality of solder interconnects and the first plurality of interconnects,
wherein the first integrated device is coupled to the second integrated device such that the polymer layer and the plurality of spacer balls are located between the first integrated device and the second integrated device;
wherein a portion of the polymer layer at least partially surrounds the plurality of spacer balls and is laterally adjacent to the underfill and in direct contact with the underfill.

24. The method of claim 23, wherein the polymer layer comprises an adhesive layer.

25. The method of claim 23, wherein the plurality of spacer balls includes particles that include mono-dispersed particles, polyethylene polymer particles, silica, glass, polymer, ceramic, and/or metal.

26. The method of claim 23, wherein the underfill is located between the first integrated device and the second integrated device.

* * * * *